United States Patent
Chuang et al.

(10) Patent No.: US 8,729,716 B2
(45) Date of Patent: May 20, 2014

(54) ALIGNMENT ACCURACY MARK

(75) Inventors: Kai-Lin Chuang, Tainan (TW); Wen-Liang Huang, Hsinchu (TW); Chia-Hung Lin, Tainan (TW); Chun-Chi Yu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 29 days.

(21) Appl. No.: 13/285,255

(22) Filed: Oct. 31, 2011

(65) Prior Publication Data
US 2013/0106000 A1 May 2, 2013

(51) Int. Cl.
H01L 23/544 (2006.01)

(52) U.S. Cl.
USPC .......................................................... 257/797

(58) Field of Classification Search
USPC ............................ 257/797, E23.179, 798, 620
See application file for complete search history.

(56) References Cited

U.S. PATENT DOCUMENTS

| 7,247,887 | B2 | 7/2007 | King et al. |
| 7,432,605 | B2 | 10/2008 | Huang et al. |
| 2007/0020565 | A1 | 1/2007 | Koh et al. |
| 2007/0158756 | A1 | 7/2007 | Dreeskornfeld et al. |
| 2008/0248429 | A1 | 10/2008 | Chou et al. |
| 2009/0233238 | A1 | 9/2009 | Hsu et al. |
| 2009/0258500 | A1 | 10/2009 | Yang et al. |
| 2009/0267240 | A1 * | 10/2009 | Chen et al. ..................... 257/797 |
| 2009/0291513 | A1 * | 11/2009 | Ghinovker et al. ............. 438/16 |
| 2010/0002933 | A1 * | 1/2010 | Yang ............................. 382/151 |

* cited by examiner

Primary Examiner — Hoa B Trinh
(74) Attorney, Agent, or Firm — J.C. Patents

(57) ABSTRACT

An alignment accuracy (AA) mark is described, including N (N≥3) pattern sets defined by N exposure steps respectively. The N exposure steps are performed also to a device area disposed on a wafer together with the AA mark. The i-th (i=1, 2 ... N−1) pattern set surrounds the (i+1)-th pattern set. Each pattern set includes a $1^{st}$ set of x-directional linear patterns, a $2^{nd}$ set of x-directional linear patterns arranged opposite to the $1^{st}$ set of x-directional linear patterns in the y-direction, a $1^{st}$ set of y-directional linear patterns, and a $2^{nd}$ set of y-directional linear patterns arranged opposite to the $1^{st}$ set of y-directional linear patterns in the x-direction, wherein each set of x- or y-directional linear patterns include at least three separate parallel linear patterns.

6 Claims, 1 Drawing Sheet

ALIGNMENT ACCURACY MARK

BACKGROUND OF THE INVENTION

1. Field of Invention

This invention relates to a semiconductor process, and more particularly relates to an alignment accuracy (AA) mark that can be used to check the alignment accuracies between at least three groups of patterns defined by the same number of exposure steps.

2. Description of Related Art

As the dimensions of semiconductor devices get further smaller, the lithographic pitch resolution of a single exposure step becomes insufficient. A method to meet the resolution requirement is to split patterns of the target wafer layer into two groups each with a larger pitch and define them by two exposure steps respectively.

In order to check the alignment accuracies between the two pattern groups of the current wafer layer and a pre- or post-layer formed before or after the target layer, in the prior art, three AA marks are formed in one AA mark area in the scribe line region of the wafer. Each of the three AA marks include two groups of patterns among the patterns defined together with the first pattern group of the current layer, the patterns defined together with the second pattern group of the current layer, and the patterns defined together with the pre- or post-layer. Hence, the AA mark area takes a large lateral area in the scribe line region, and the alignment accuracy measurement has to be conducted three times for the three AA marks and therefore spends more time.

SUMMARY OF THE INVENTION

Accordingly, this invention provides an alignment accuracy (AA) mark capable of solving the above issues.

The AA mark of this invention includes N (N≥3) pattern sets defined by N exposure steps respectively. The N exposure steps are performed also to a device area on a wafer together with the AA mark. The i-th (i=1, 2 . . . N−1) pattern set surrounds the (i+1)-th pattern set. Each of the N pattern sets includes a $1^{st}$ set of x-directional linear patterns, a $2^{nd}$ set of x-directional linear patterns arranged opposite to the $1^{st}$ set of x-directional linear patterns in the y-direction, a $1^{st}$ set of y-directional linear patterns, and a $2^{nd}$ set of y-directional linear patterns arranged opposite to the $1^{st}$ set of y-directional linear patterns in the x-direction, wherein each set of x- or y-directional linear patterns include at least three separate parallel linear patterns.

In an embodiment of this invention, in each pattern set of the AA mark, the $1^{st}$ set of x-directional linear patterns, the $1^{st}$ set of y-directional linear patterns, the $2^{nd}$ set of x-directional linear patterns and the $2^{nd}$ set of y-directional linear patterns are connected with one another to form at least three contiguous rings.

In another embodiment of this invention, the AA mark further includes, at four corners of the N pattern sets, four dummy blocks that comprise the material of at least one of the N pattern sets, wherein in each pattern set, the $1^{st}$ set of x-directional linear patterns, the $1^{st}$ set of y-directional linear patterns, the $2^{nd}$ set of x-directional linear patterns and the $2^{nd}$ set of y-directional linear patterns are not connected to each other.

In both of the above embodiments, the AA mark may further include a dummy block that is surrounded by the N-th pattern set and includes the material of at least one of the N pattern sets.

Since at least three pattern sets defined by the same number of exposure steps are disposed in the AA mark of this invention, only one AA mark is needed to check the alignments between at least three groups of device patterns defined by the at least three exposure steps. Hence, the AA mark area takes a smaller lateral area in the scribe line region and the AA measurement is quicker.

For example, in a case where the alignment accuracies between two split pattern groups defined by two exposure steps and the patterns of an upper/lower layer defined by another exposure step are to be checked, three conventional AA marks are required as mentioned above, while only one AA mark is required in this invention.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit the scope of this invention.

Figure 1:
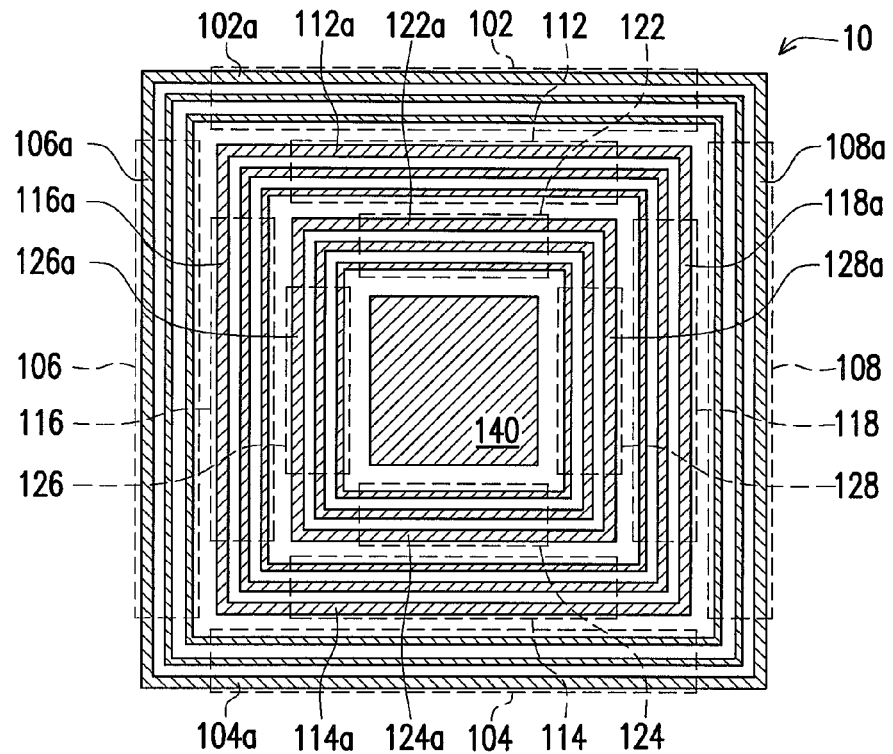
FIG. 1 illustrates a top view of an alignment accuracy mark according to a first embodiment of this invention.

FIG. 1 illustrates a top view of an alignment accuracy mark according to a first embodiment of this invention.

Referring to FIG. 1, the AA mark includes three (N=3) pattern sets 102/104/106/108, 112/114/116/118 and 122/124/126/128 defined by three exposure steps respectively, and a dummy block 140 at the center thereof. The three exposure steps are performed also to a device area (not shown) on a wafer together with the alignment accuracy mark, wherein the method of simultaneously defining patterns in the AA mark area within the scribe line region and in the device areas, which is based on the photomask design, is well known in the art and therefore not illustrated here. The $1^{st}$ pattern set 102/104/106/108 as the outmost pattern set surrounds the $2^{nd}$ pattern set 112/114/116/118. The $2^{nd}$ pattern set 112/114/116/118 surrounds the $3^{rd}$ pattern set 122/124/126/128 as the inmost pattern set.

The first pattern set 102/104/106/108 includes a $1^{st}$ set of x-directional linear patterns 102, a $2^{nd}$ set of x-directional linear patterns 104 arranged opposite to the $1^{st}$ set of x-directional linear patterns 102 in the y-direction, a $1^{st}$ set of y-directional linear patterns 106, and a $2^{nd}$ set of y-directional linear patterns 108 arranged opposite to the $1^{st}$ set of y-directional linear patterns 106 in the x-direction, wherein each set of x- or y-directional linear patterns 102, 104, 106 or 108 includes at least three separate parallel linear patterns. As compared to the prior-art case of using a single linear pattern to indicate the x- or y-directional overlay error, the design of three parallel linear patterns allows an easier optical proximity correction (OPC) and a smaller noise in the position determination/measurement. The method for the position measurement can be easily found in the prior art, possibly including scanning with a light beam and simultaneously detecting the reflected light to plot a position-light intensity curve and then calculating the mean position of the three linear patterns from the curve, and is not described in details here.

In addition, the four sets of x- and y-directional linear patterns 102, 104, 106 and 108 may include two or more different widths. For example, the outmost linear patterns 102a, 104a, 106a and 108a in the four sets of linear patterns may be wider than the other linear patterns.

The second pattern set 112/114/116/118 surrounded by the first pattern set 102/104/106/108 includes a $1^{st}$ set of x-directional linear patterns 112, a $2^{nd}$ set of x-directional linear patterns 114 arranged opposite to the $1^{st}$ set of x-directional linear patterns 112 in the y-direction, a $1^{st}$ set of y-directional linear patterns 116, and a $2^{nd}$ set of y-directional linear patterns 118 arranged opposite to the $1^{st}$ set of y-directional linear patterns 116 in the x-direction, wherein each set of x- or y-directional linear patterns 112, 114, 116 or 118 includes at least three separate parallel linear patterns. The four sets of x- and y-directional linear patterns 112, 114, 116 and 118 may have two or more different widths. For example, the outmost linear patterns 112a, 114a, 116a and 118a in the four sets of linear patterns may be wider than the other linear patterns, for the same reason mentioned in the case of the first pattern set 102/104/106/108.

The third pattern set 122/124/126/128 as the inmost pattern set surrounded by the second pattern set 112/114/116/118 includes a $1^{st}$ set of x-directional linear patterns 122, a $2^{nd}$ set of x-directional linear patterns 124 arranged opposite to the $1^{st}$ set of x-directional linear patterns 122 in the y-direction, a $1^{st}$ set of y-directional linear patterns 126, and a $2^{nd}$ set of y-directional linear patterns 128 arranged opposite to the $1^{st}$ set of y-directional linear patterns 126 in the x-direction, wherein each set of x- or y-directional linear patterns 122, 124, 126 or 128 includes at least three separate parallel linear patterns. The four sets of x- and y-directional linear patterns 122, 124, 126 and 128 may have two or more different widths. For example, the outmost linear patterns 122a, 124a, 126a and 128a in the four sets of linear patterns may be wider than the other linear patterns, for the same reasons mentioned in the above cases.

In this embodiment, in each of the $1^{st}$ to $3^{rd}$ pattern sets 102/104/106/108, 112/114/116/118 and 122/124/126/128, the $1^{st}$ set of x-directional linear patterns 102 (or 112, or 122), the $1^{st}$ set of y-directional linear patterns 106 (or 116, or 126), the $2^{nd}$ set of x-directional linear patterns 104 (or 114, or 124) and the $2^{nd}$ set of y-directional linear patterns 108 (or 118, or 128) are connected with one another to form at least three contiguous rings including the ring 102a+106a+104a+108a (or 112a+116a+114a+118a, or 122a+126a+124a+128a).

The dummy block 140 is surrounded by the $3^{rd}$ pattern set 122/124/126/128 as the inmost pattern set. The dummy block 140 includes the material of at least one of the $1^{st}$ to $3^{rd}$ pattern sets and is much wider than the narrow patterns in the above sets of x-directional and y-directional linear patterns 102-128, thus being capable of preventing damage to the narrow x-directional and y-directional linear patterns in a subsequent removal process, such as a chemical mechanical polishing (CMP) process.

In addition, it is possible that two or more pattern sets among the three pattern sets 102/104/106/108, 112/114/116/118 and 122/124/126/128 are formed from a single wafer layer defined by two or more exposure steps among the three exposure steps. For example, it is possible that second and the third pattern sets 112/114/116/118 and 122/124/126/128 are formed from a single wafer layer defined by two exposure steps and the first pattern set 102/104/106/108 formed from a pre- or post-layer formed before or after the current wafer layer. The two groups of device patterns formed from the current wafer layer may be two split pattern groups as described above.

Figure 2:
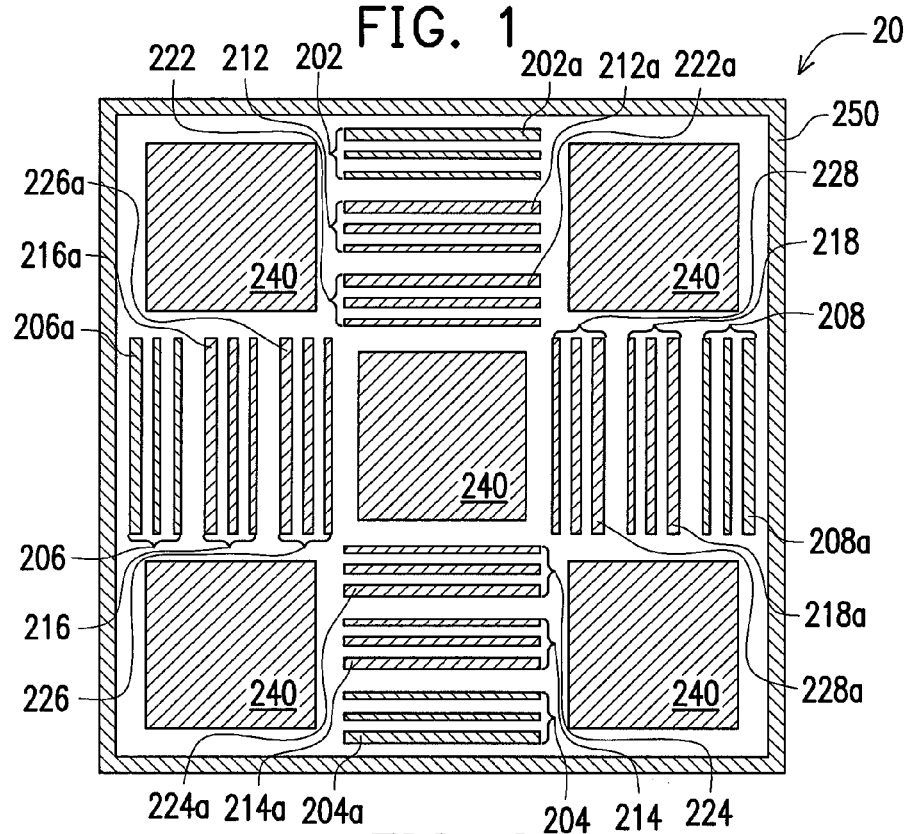
FIG. 2 illustrates a top view of an alignment accuracy mark according to a second embodiment of this invention.

FIG. 2 illustrates a top view of an alignment accuracy mark according to a second embodiment of this invention.

Referring to FIG. 2, the AA mark includes three pattern sets 202/204/206/208, 212/214/216/218 and 222/224/226/228 defined by three exposure steps respectively, four dummy blocks 240 at four corners of the three (N=3) pattern sets, another dummy block 240 at the center of the three pattern sets, and a dummy ring 250 as the outmost part of the AA mark. The three exposure steps are performed also to a device area (not shown) on a wafer, as in the case of the first embodiment. The $1^{st}$ pattern set 202/204/206/208 as the outmost pattern set surrounds the $2^{nd}$ pattern set 212/214/216/218. The $2^{nd}$ pattern set 212/214/216/218 surrounds the $3^{rd}$ pattern set 222/224/226/228 as the inmost pattern set.

The first pattern set as the outmost pattern set includes a $1^{st}$ set of x-directional linear patterns 202, a $2^{nd}$ set of x-directional linear patterns 204 arranged opposite to the $1^{st}$ set of x-directional linear patterns 202 in the y-direction, a $1^{st}$ set of y-directional linear patterns 206, and a $2^{nd}$ set of y-directional linear patterns 208 arranged opposite to the $1^{st}$ set of y-directional linear patterns 206 in the x-direction, wherein each set of x- or y-directional linear patterns 202, 204, 206 or 208 includes at least three separate parallel linear patterns. The four sets of x- and y-directional linear patterns 202, 204, 206 and 208 may include two or more different widths. For example, the outmost linear patterns 202a, 204a, 206a and 208a in the four sets of linear patterns may be wider than the other linear patterns, for the same reasons mentioned in the above cases.

The second pattern set surrounded by the first pattern set includes a $1^{st}$ set of x-directional linear patterns 212, a $2^{nd}$ set of x-directional linear patterns 214 arranged opposite to the $1^{st}$ set of x-directional linear patterns 212 in the y-direction, a $1^{st}$ set of y-directional linear patterns 216, and a $2^{nd}$ set of y-directional linear patterns 218 arranged opposite to the $1^{st}$ set of y-directional linear patterns 216 in the x-direction, wherein each set of x- or y-directional linear patterns 212, 214, 216 or 218 includes at least three separate parallel linear patterns. The four sets of x- and y-directional linear patterns 212, 214, 216 and 218 may include two or more different widths. For example, the outmost linear patterns 212a, 214a, 216a and 218a in the four sets of linear patterns may be wider than the other linear patterns, for the same reasons mentioned in the above cases.

The third pattern set as the inmost pattern set surrounded by the second pattern set includes a $1^{st}$ set of x-directional linear patterns 222, a $2^{nd}$ set of x-directional linear patterns 224 arranged opposite to the $1^{st}$ set of x-directional linear patterns 222 in the y-direction, a $1^{st}$ set of y-directional linear patterns 226, and a $2^{nd}$ set of y-directional linear patterns 228 arranged opposite to the $1^{st}$ set of y-directional linear patterns 226 in the x-direction, wherein each set of x- or y-directional linear patterns 222, 224, 226 or 228 includes at least three separate parallel linear patterns. The four sets of x- and y-directional linear patterns 222, 224, 226 and 228 may have two or more different widths. For example, the outmost linear patterns 222a, 224a, 226a and 228a in the four sets of linear patterns may be wider than the other linear patterns, for the same reasons mentioned in the above cases.

In this embodiment, in each of the $1^{st}$ to $3^{rd}$ pattern sets 202/204/206/208, 212/214/216/218 and 222/224/226/228, the $1^{st}$ set of x-directional linear patterns 202 (or 212, or 222), the $1^{st}$ set of y-directional linear patterns 206 (or 216, or 226), the $2^{nd}$ set of x-directional linear patterns 204 (or 214, or 224)

and the $2^{nd}$ set of y-directional linear patterns 208 (or 218, or 228) are not connected with each other. Each of the four corner dummy blocks 240 disposed at the four corners of the three pattern sets may be disposed in a manner such that a first edge thereof is near one end of each x-directional linear pattern in the first or second sets of x-directional linear patterns (202, 212 and 222, or 204, 214 and 224) of all the three pattern sets, and a second edge thereof neighboring to the first edge is near one end of each y-directional linear pattern in the first or second sets of y-directional linear patterns (206, 216 and 226, or 208, 218 and 228) of all the three pattern sets.

As in the case of the AA mark of the first embodiment including only the central dummy block 140, the four corner dummy blocks 240 and the central dummy block 240 in this embodiment include the material of at least one of the $1^{st}$ to $3^{rd}$ pattern sets, and are each much wider than the narrow patterns in the above sets of x- and y-directional linear patterns 202-228, thus being capable of preventing damage to the narrow linear patterns in a subsequent removal process, such as a CMP process.

The dummy ring 250 surrounds the first pattern set 202/204/206/208 and the dummy blocks 240, and includes the material of the first pattern 202/204/206/208. The dummy ring 250 has a function of reducing the microloading effect of a subsequent removal process, such as a CMP process.

In both of the above first and second embodiments of this invention, since the three pattern sets defined by the three exposure steps are disposed in the AA mark, only one AA mark is needed to check the alignments between three groups of device patterns defined by the three exposure steps. Hence, as compared to the prior art that requires three AA marks for the same checking, the AA mark area takes a smaller lateral area in the scribe line region and the AA measurement is quicker with this invention.

Moreover, though N=3 and each set of x- or y-directional linear patterns include three linear patterns in both of the above embodiments, the N-value can be larger and each set of x- or y-directional linear patterns can include more than three linear patterns in other embodiments.

For example, when N=4, the AA mark area takes an even smaller lateral area in the scribe line region and the AA measurement is even quicker with this invention, as compared to the prior art that requires six ($C_2^4$) AA marks for the same checking.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An alignment accuracy (AA) mark, comprising:
    N (N≥3) pattern sets defined by N exposure steps respectively, wherein each of the pattern sets is defined by an exposure step respectively,
    the i-th (i=1, 2 . . . N−1) pattern set surrounds the (i+1)-th pattern set, and
    each of the N pattern sets comprises a $1^{st}$ set of x-directional linear patterns, a $2^{nd}$ set of x-directional linear patterns arranged opposite to the $1^{st}$ set of x-directional linear patterns in the y-direction, a $1^{st}$ set of y-directional linear patterns, and a $2^{nd}$ set of y-directional linear patterns arranged opposite to the $1^{st}$ set of y-directional linear patterns in the x-direction, wherein each set of x- or y-directional linear patterns include at least three separate parallel linear patterns, and
    a plurality of dummy blocks, each of the dummy blocks surrounded by least one of the $1^{st}$ set of x-directional linear patterns and the $2^{nd}$ set of x-directional linear patterns, and least one of the $1^{st}$ set of y-directional linear patterns and the $2^{nd}$ set of y-directional linear patterns, and comprising a material of at least one of the N pattern sets,
    wherein the plurality of dummy blocks comprises, at four corners of the N pattern sets, four first dummy blocks.

2. The AA mark of claim 1, wherein each first dummy block has:
    a first edge near one end of each x-directional linear pattern in the first or second sets of x-directional linear patterns of all the N pattern sets, and
    a second edge neighboring to the first edge and near one end of each y-directional linear pattern in the first or second sets of y-directional linear patterns of all the N pattern sets.

3. The AA mark of claim 1, further comprising a dummy ring that surrounds the first pattern set and the dummy blocks and comprises a material of the first pattern set.

4. The AA mark of claim 1, wherein the plurality of dummy blocks further comprises a second dummy block surrounded by the N-th pattern set.

5. The AA mark of claim 1, wherein two or more pattern sets among the N pattern sets are formed from a single wafer layer defined by two or more exposure steps among the N exposure steps.

6. The AA mark of claim 1, wherein in the $1^{st}$ set of x-directional linear patterns, the $1^{st}$ set of y-directional linear patterns, the $2^{nd}$ set of x-directional linear patterns and the $2^{nd}$ set of y-directional linear patterns of at least one of the N pattern sets, the outmost linear patterns are wider than the other linear patterns.

* * * * *